(12) United States Patent
Groepl et al.

(10) Patent No.: US 8,194,431 B2
(45) Date of Patent: Jun. 5, 2012

(54) PROGRAMMABLE ANTIFUSE TRANSISTOR AND METHOD FOR PROGRAMMING THEREOF

(75) Inventors: Martin Groepl, Sonthofen/Oberallgaeu (DE); Holger Hoeltke, Munich (DE)

(73) Assignee: Silicon Line GmbH, Munich (DE)

( * ) Notice: Subject to any disclaimer, the term of this patent is extended or adjusted under 35 U.S.C. 154(b) by 54 days.

(21) Appl. No.: 12/901,515

(22) Filed: Oct. 9, 2010

(65) Prior Publication Data

US 2011/0080765 A1 Apr. 7, 2011

Related U.S. Application Data

(63) Continuation of application No. PCT/EP2009/054483, filed on Apr. 16, 2009.

(30) Foreign Application Priority Data

Apr. 16, 2008 (DE) .......................... 10 2008 001 217
Mar. 26, 2009 (DE) .......................... 10 2009 001 923

(51) Int. Cl.
*G11C 17/00* (2006.01)
(52) U.S. Cl. ................... 365/96; 365/225.7; 365/185.28
(58) Field of Classification Search .................... 365/96, 365/225.7, 185.28
See application file for complete search history.

(56) References Cited

U.S. PATENT DOCUMENTS

| 5,012,384 | A  |  4/1991 | Chew |
| 5,019,769 | A  |  5/1991 | Levinson |
| 5,672,994 | A  |  9/1997 | Au et al. |
| 5,834,813 | A  | 11/1998 | Ma et al. |
| 6,031,855 | A  |  2/2000 | Watanabe |
| 6,650,143 | B1 | 11/2003 | Peng |
| 6,667,661 | B1 | 12/2003 | Liu et al. |
| 6,812,733 | B1 | 11/2004 | Plasterer et al. |
| 6,897,543 | B1 * |  5/2005 | Huang et al. ................. 257/530 |
| 6,965,722 | B1 | 11/2005 | Nguyen |
| 7,133,429 | B2 | 11/2006 | Moran |
| 7,154,923 | B2 | 12/2006 | Kucharski |
| 7,173,851 | B1 |  2/2007 | Callahan et al. |

(Continued)

FOREIGN PATENT DOCUMENTS

DE 10 2004 032456 B3 4/2006

(Continued)

OTHER PUBLICATIONS

U.S. Appl. No. 12/654,515, filed Dec. 2009, Groepl et al.

(Continued)

*Primary Examiner* — Son Dinh
*Assistant Examiner* — Nam Nguyen
(74) *Attorney, Agent, or Firm* — Shlesinger, Arkwright & Garvey LLP

(57) ABSTRACT

Programmable antifuse transistor, in particular n-channel MOS transistor, and a method for programming at least one such antifuse transistor, includes at least one gate with a gate terminal, source with a source terminal, drain with a drain terminal, and substrate with a substrate terminal, configured so that active circuits/circuit elements do not have to be located at a distance from the antifuse, minimizing area requirements, without additional process steps the level of the potential difference between source terminal and substrate terminal is less than about 0.5 volts, drain terminal and source terminal lie at different potentials. By adjusting drain-source voltage and/or the gate-source voltage a flow of charge carriers occurs between source and drain, causing semiconductor material between source and drain to be thermally heated and to locally melt, forming at least one permanently conducting channel between source and drain.

19 Claims, 3 Drawing Sheets

U.S. PATENT DOCUMENTS

| | | | |
|---|---|---|---|
| 7,272,067 | B1 | 9/2007 | Huang et al. |
| 7,280,425 | B2 | 10/2007 | Keshavarzi et al. |
| 7,595,661 | B2 | 9/2009 | Kim |
| 2002/0117724 | A1 | 8/2002 | Ariyoshi et al. |
| 2003/0058725 | A1 | 3/2003 | Bell |
| 2003/0094977 | A1 | 5/2003 | Li et al. |
| 2004/0160996 | A1 | 8/2004 | Giorgi et al. |
| 2004/0195978 | A1 | 10/2004 | Horiuchi et al. |
| 2004/0208011 | A1 | 10/2004 | Horiuchi et al. |
| 2005/0185428 | A1 | 8/2005 | Crawford et al. |
| 2007/0291807 | A1 | 12/2007 | Uesaka |
| 2008/0007985 | A1 | 1/2008 | Wilcox |
| 2008/0012507 | A1 | 1/2008 | Nalbant |
| 2008/0304527 | A1 | 12/2008 | Gao et al. |

FOREIGN PATENT DOCUMENTS

| | | |
|---|---|---|
| EP | 0 798 828 A | 10/1997 |
| EP | 1 777 708 A1 | 4/2007 |
| EP | 1 816 723 A2 | 8/2007 |
| FR | 2 889 643 A | 2/2007 |
| GB | 2 365 788 A | 2/2002 |
| WO | WO2007/069104 A | 6/2007 |
| WO | WO2008/050779 A | 5/2008 |

OTHER PUBLICATIONS

U.S. Appl. No. 12/654,951, filed Jan. 2010, Groepl et al.
U.S. Appl. No. 12/654,514, filed Dec. 2009, Groepl et al.
U.S. Appl. No. 12/950,766, filed Nov. 2010, Groepl et al.
U.S. Appl. No. 13/083,282, filed Apr. 2011, Groepl et al.
PCT International Preliminary Report on Patentability and Written Opinion in application No. PCT/EP2009/054483, dated Nov. 9, 2010 (7 pages).
International Search Report (ISR) in application No. PCT/EP2009/054483, dated Jul. 21, 2009 (4 pages).

* cited by examiner

PROGRAMMABLE ANTIFUSE TRANSISTOR AND METHOD FOR PROGRAMMING THEREOF

CROSS-REFERENCE TO RELATED APPLICATIONS

This application is a continuation of application no. PCT/EP2009/054483, filed 16 Apr. 2009, which claims the priority of German application no. 10 2008 001 217.3, filed 16 Apr. 2008, and which application no. PCT/EP2009/054483, filed 16 Apr. 2009, claims the priority of German application no. 10 2009 001 923.5, filed 26 Mar. 2009, and each of which is incorporated herein by reference.

FIELD OF THE INVENTION

The present invention relates to a programmable antifuse transistor. More particularly, the present invention relates to a programmable antifuse transistor, in particular an n-channel MOS transistor. The present invention further relates to an antifuse circuit arrangement, in particular a one-time electrically programmable permanent storage cell. The present invention further relates to an antifuse circuit arrangement of this type which may be configured as an area-efficient, one-time electrically programmable permanent storage cell designed for the non-volatile storage of bits. The present invention further relates to a method for programming at least one antifuse transistor of the above types.

BACKGROUND OF THE INVENTION

For example, metal oxide transistors [metal-oxide-semiconductor (field-effect transistors) or MOS(FETs)] are used within the technical field of electrically programmable storage cells.

In principle, a metal oxide transistor may be used as an electrically programmable fuse device, which does not interrupt, but instead produces an electrically conductive connection during programming (so-called antifuse technology).

For example, an n-channel MOS transistor has four terminals, namely a gate, source (n-doped), substrate (p-doped) and drain (n-doped). It should be noted accordingly that a parasitic npn bipolar transistor is formed from the source (emitter)-substrate (base)-drain (collector) fields (or regions).

If, during programming, the substrate voltage, i.e. the base voltage, is raised positively relative to the source voltage, i.e. the emitter voltage, charge carriers will be generated in the substrate region (base) across the pn junction between the substrate and the source; by applying a voltage at the drain being positive relative to the source, a current will flow which is generated in the substrate region by the charge carrier injection.

If the current between the source and the drain is selected to be sufficiently high, there will be local thermal heating between the source and the drain until local melting of the semiconductor material occurs; this local thermal heating is of such a magnitude that the semiconductor material melts; a permanent conducting channel is thus being established between the source and the drain, the conductivity of which is about 10,000 times greater than in the unprogrammed state.

An electrically programmable antifuse of this type is disclosed in the prior art, for example in publication U.S. Pat. No. 7,272,067 B1. As a result of the insulation layer arranged between the two p-type substrates in the form of a deep n-well, additional process steps are required, which complicates production of these known electrically programmable antifuses and incurs higher production costs.

In the electrically programmable antifuse according to publication U.S. Pat. No. 7,272,067 B1, the substrate potential is raised, relative to the source potential, to such an extent that a pn diode (with a forward voltage of about 0.6 volts) arranged between the substrate and the source allows a considerable current flow as a result of the polarity in the forward direction.

In this instance it has proven to be disadvantageous that no active circuits or active circuit parts can be operated during programming in the vicinity of the antifuse since, as result of the increased substrate potential, the function of active circuit(s)/circuit part(s) of this type is at least limited, or else they may even no longer be operational.

Alternatively or in addition, the prior art also poses the risk that a parasitic thyristor may be ignited by increasing the substrate potential (so-called latch-up effect or single event latch-up, SEL for short).

In this instance there is a malfunction in the electronic semiconductor component: an electrical short circuit of the supply voltage of the relevant component, which will generally lead to thermal destruction of the circuit if there are no safety measures.

For this reason, the prior art according to publication U.S. Pat. No. 7,272,067 B1 states that active circuit(s)/circuit part(s) in the same circuit arrangement (integrated circuits or ICs) must be arranged at a considerable distance from the antifuse, for example at a distance of about one hundred micrometers, thus resulting in a high area overhead that runs contrary to the general trend for miniaturising circuit arrangements.

Reference is also made to the following prior art
publication U.S. Pat. No. 6,650,143 B1, in which a programmable gate array is disclosed,
publication EP 1 777 708 A1, in which a non-volatile 3,5 transistor storage cell with gate oxide breakthrough is disclosed,
publication U.S. Pat. No. 7,280,425 B2, in which a one-time programmable antifuse cell is disclosed, and
publication US 2008/0007985 A1, in which an antifuse circuit with a biased transistor is disclosed.

OBJECTS AND SUMMARY OF THE INVENTION

An object of the present invention is to overcome the drawbacks of the prior art.

Another object of the present invention is to develop an antifuse transistor of the type mentioned at the outset.

Starting from the above disadvantages and inadequacies and in consideration of the prior art outlined above, an object of the present invention is to develop an antifuse transistor of the type mentioned at the outset, an antifuse circuit arrangement of the type mentioned at the outset, and a method of the type mentioned at the outset, in such way that active circuits/circuit elements do not have to be located at a significant distance from the antifuse, thereby minimizing the area requirements, without any additional process steps being needed.

This object is achieved by an antifuse transistor having the features disclosed in claim 1, by an antifuse circuit arrangement having the features disclosed in claim 7, and by a method having the features disclosed in claim 10. Advantageous embodiments and expedient developments of the present invention are characterized in the respective subclaims.

The present invention, which can likewise be used with n-channel MOS transistors, p-channel MOS transistors or comparable transistor structures, will be described hereinafter (in a purely exemplary manner) with reference to an n-channel MOS transistor equipped with four terminals (gate, source, drain, substrate).

In this instance the use of an n-channel MOS transistor is generally preferred since, compared to a p-channel MOS transistor, it exhibits greater conductivity (the charge carrier mobility of an n-channel MOS transistor is greater than the charge carrier mobility of a p-channel MOS transistor); for this reason the explanation below is given in an exemplary manner with reference to an n-channel MOS transistor:

In accordance with the teaching of the present invention, during programming the level of the potential difference between the source terminal and the substrate terminal is no more than about 0.5 volts, in particular no more than about 0.3 volts. The level of the potential difference between the source terminal and the substrate terminal is particularly preferably selected to be smaller than the forward voltage of silicon pn junctions or silicon pn diodes so as to avoid a latch-up of adjacent circuits.

The source terminal and the substrate terminal are advantageously kept at substantially the same potential during programming, in particular are kept jointly at a reference potential, for example at ground potential, at zero potential or at earth potential (ground or GND), for example by a metal connection (so-called short circuit).

The level of the potential difference between the drain terminal of the antifuse transistor and the source terminal of the antifuse transistor during programming is advantageously greater than, for example more than double the maximum permissible nominal continuous operating voltage of similar MOS transistors.

In the present invention, a maximum drain-source voltage level is expediently combined with a minimum level of the electric field strength between the gate and the conducting channel; the drain terminal is thus preferably brought to a considerably higher potential during programming compared with the reference potential, for example to about +4 volts.

By applying a positive gate-source voltage being about half the value or slightly more than half the value of the drain-source voltage during programming, i.e. is between about 0.4 times and about 0.7 times the drain-source voltage (for example at about +2 volts), at least one conductive charge carrier channel is formed between the source and the drain and therefore current is flowing between the source and the drain.

According to a preferred embodiment of the present invention, this flow of current is of such a size, with a suitable selection of drain-source and gate-source voltages, that there is local thermal heating of the semiconductor material between the source and the drain. If this local thermal heating is so high that the semiconductor material between the source and the drain melts, this melting process will produce a permanent conducting channel between the source and the drain, the conductivity of which channel will be about 10,000 times greater than in the unprogrammed state.

The antifuse transistor according to the present invention, the antifuse circuit arrangement according to the present invention, and the method according to the present invention feature, in particular, a high level of integration with other active circuit parts since there is no need for an increased safety distance between the antifuse and the active circuit.

Whilst the substrate potential is conventionally increased, for example in the method according to publication U.S. Pat. No. 7,272,067 B1 from the prior art, in accordance with the invention the substrate remains at a fixed reference potential, for example at earth potential (ground or GND).

By increasing the drain terminal to a considerably higher potential compared with the reference potential and by applying a positive gate-source voltage, the substrate potential is not (or is only insignificantly) increased in such way that active circuit(s)/circuit part(s) do not have to be arranged at a considerable distance from the antifuse.

Instead, in accordance with the invention the transistor is effectively temporarily overloaded in a defined manner; an about 1.2 volt transistor can thus be operated temporarily with a maximum voltage of about 2 volts between the gate and the source-drain channel. In this example both the drain-gate voltage and the gate-source voltage are about +2 volts, thus producing a drain-source voltage of about +4 volts.

With reference to the present invention, a person skilled in the art of one-time electrically programmable permanent storage cells based on transistor technology will in particular appreciate that a conductive connection will be formed, as described above, by melting the semiconductor material, preferably in the substrate, i.e. a conducting connection will preferably not be formed within the gate oxide.

High long-term stability is expected for such areas in the substrate since a voluminous conducting channel can be formed between the drain and the source by the melting of the semiconductor material beneath the gate oxide, the conductivity of which channel shows low risk of decreasing as a result of tiny ruptures.

The present invention finally relates to the use of at least one antifuse transistor, in particular at least one n-channel MOS transistor in accordance with the type detailed above and/or a method according to the type detailed above in at least one antifuse circuit arrangement, in particular in at least one area-efficient, one-time electrically programmable permanent storage cell according to the type detailed above for non-volatile storage of bits, for example in at least one C[omplementary]M[etal]O[xide]S[emiconductor] I[ntegrated]C[ircuit] analogue circuit.

As already discussed above, there are various possibilities for embodying and developing the teaching of the present invention in an advantageous manner. For this purpose, on the one hand reference is made to the claims subordinated to claim 1, to claim 7 and to claim 10, and on the other hand further embodiments, features and advantages of the present invention are explained in greater detail below, inter alia with reference to the exemplary embodiment illustrated by FIG. 1 to FIG. 2B.

BRIEF DESCRIPTION OF THE DRAWINGS

It is shown in.

Like or similar embodiments, elements or features are provided with identical reference numerals in FIG. 1 to FIG. 2C.

DETAILED DESCRIPTION OF THE INVENTION

Figure 1:
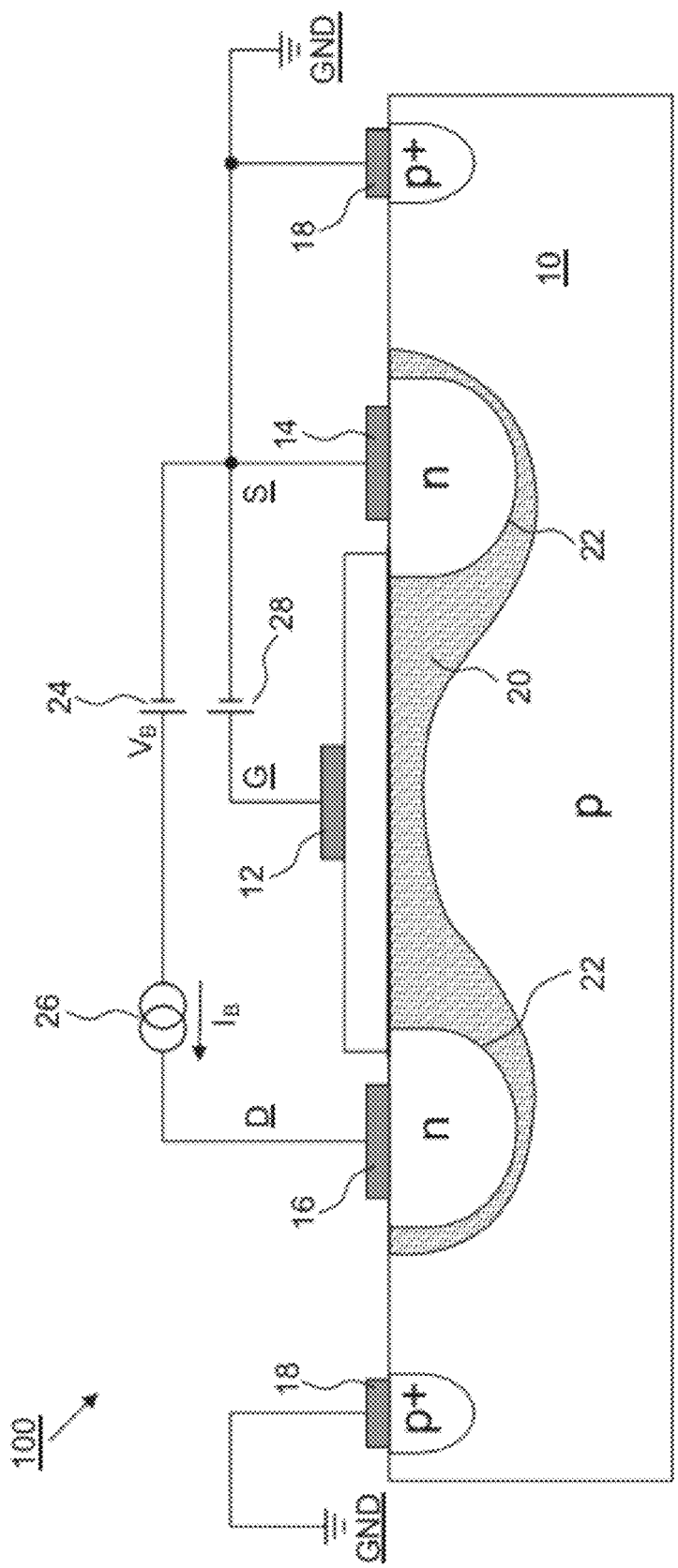
FIG. 1 in a schematic cross-sectional view an embodiment of an antifuse transistor according to the present invention being programmable by the method according to the present invention.

FIG. 1 shows a schematic cross-sectional view of an embodiment of a programmable antifuse n-channel MOS transistor 100 according to the present invention that operates by the method according to the present invention and the conductivity of which in the programmed state is about 10,000 times greater than in the unprogrammed state.

The antifuse transistor 100 comprises
  a gate G with terminal (=gate contact or gate terminal) 12,
  a source S with terminal (=source contact or source terminal) 14,
  a drain D with terminal (=drain contact or drain terminal) 16 and
  a substrate 10 with terminal (=substrate contact or substrate terminal) 18 (the source S corresponds to an emitter; the drain D corresponds to a collector; the substrate 10 corresponds to a base).

The level of the potential difference between the source terminal 14 and the substrate terminal 18 is generally selected to be smaller than the forward voltage of silicon pn junctions 22 arranged in a closer vicinity, for example at a distance of about one micrometer.

In this instance the level of the potential difference between the source terminal 14 and the substrate terminal 18 is no more than about 0.5 volts at most, in particular no more than about 0.3 volts; in the specific embodiment of FIG. 1, the source terminal 14 and the substrate terminal 18 lie jointly at a reference potential, namely at ground or zero potential (=earth potential GND).

The drain terminal 16 and the source terminal 14 lie at different potentials during programming, i.e. in particular during melting, the level of this potential difference between the drain terminal 16 and the source terminal 14 being more than double the maximum permissible nominal (continuous) operating voltage of the n-channel MOS transistor 100; in the embodiment of FIG. 1 the drain terminal 16 is at a higher potential compared with the reference potential GND.

In FIG. 1 the region 20 of the p-substrate 10 defined, inter alia, by the silicon pn junctions 22 is hatched and is modified by the programming, i.e. by the melting, to such an extent that this region is now n diffused.

A voltage source 24 for providing the voltage $V_B$ (for example about 4.2 volts up to about 5 volts) adapted for the burning or melting process is arranged between the drain terminal 16 and the source terminal 14 for adjusting the drain source voltage (cf. FIG. 1).

A current-limiting component in the form of a current source 26 for the burning or melting current $I_B$ is also available between the drain terminal 16 and the source terminal 14, more specifically in series with the burning or melting voltage source 24.

A component 28 defining the voltage at the gate G is arranged between the gate terminal 12 and the source terminal 14 for adjusting the gate-source voltage (cf. FIG. 1).

Figure 2A:
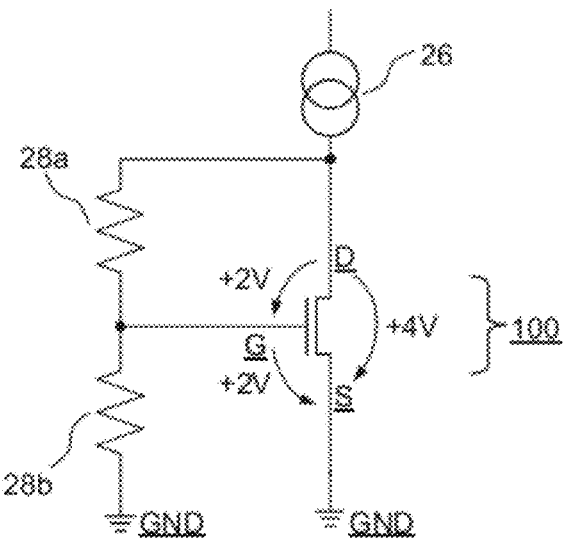
FIG. 2A in a schematic view a preliminary stage of a first embodiment for an antifuse circuit arrangement according to the present invention comprising the antifuse transistor of FIG. 1.
Figure 2B:
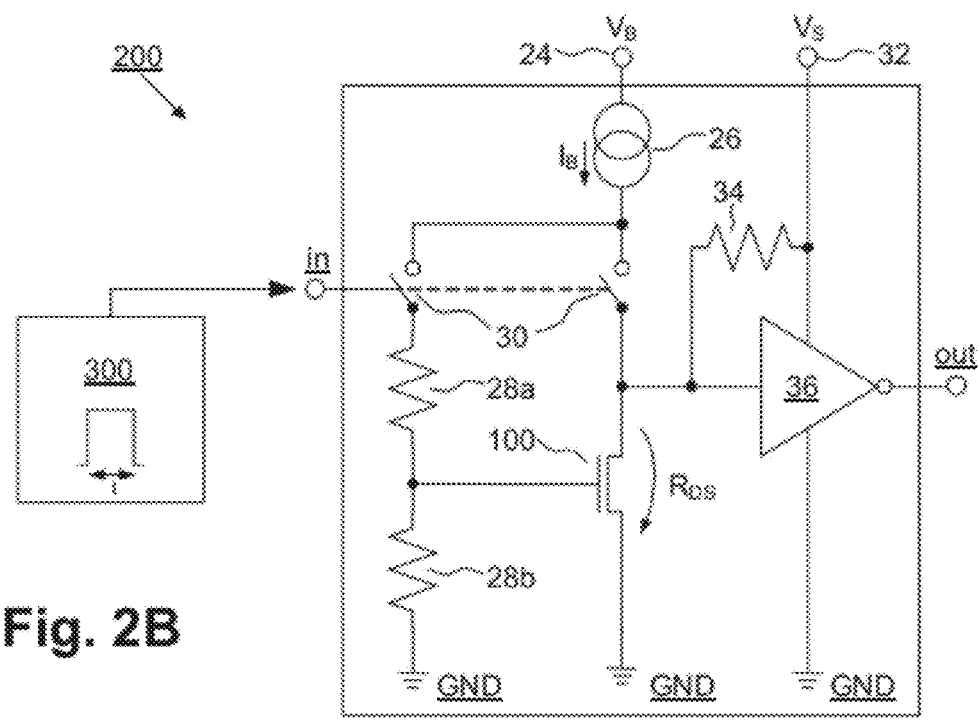
FIG. 2B in a schematic view the first embodiment for the antifuse circuit arrangement of FIG. 2A in the form of an area-efficient, one-time electrically programmable permanent storage cell being programmable by the method according to the present invention and comprises the antifuse transistor of FIG. 1.

As can be seen in FIG. 2A (=pre-stage) and FIG. 2B, which show schematic views of a first embodiment of an antifuse circuit arrangement 200 comprising the antifuse transistor 100 according to FIG. 1, the component 28 defining the voltage at the gate G and shown in simplified form in FIG. 1 as a voltage source 28 for a defined biasing of the gate G is configured in the form of a voltage divider arrangement 28a, 28b in the first embodiment of the antifuse circuit arrangement 200.

In this instance
  the first resistor 28a of the voltage divider is connected between the drain terminal 16 and the gate terminal 12, and
  the second resistor 28b of the voltage divider is connected between the gate terminal 12 and the reference potential GND.

The current-limiting component 26 is associated with the drain terminal 16 and with the side of the first resistor 28a of the voltage divider remote from the gate G.

Both resistors 28a, 28b of the voltage divider arrangement are high resistance, for example to the order of a couple of hundred kilohms.

Figure 2C:
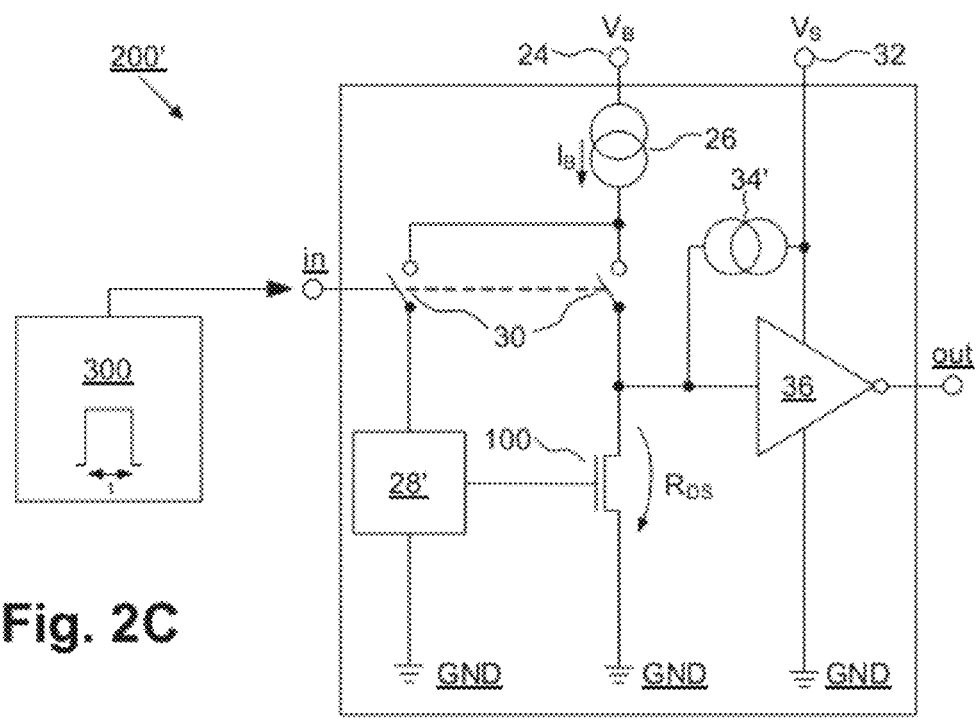
FIG. 2C in a schematic view a second embodiment of an antifuse circuit arrangement in the form of an area-efficient, one-time electrically programmable permanent storage cell being programmable by the method according to the present invention and comprises the antifuse transistor of FIG. 1.

As can be seen in FIG. 2C, which shows a schematic view of a second embodiment of an antifuse circuit arrangement 200' comprising the antifuse transistor 100 according to FIG. 1, the component 28 defining the voltage at the gate G and shown in simplified form in FIG. 1 as a voltage source 28 for a defined biasing of the gate G is configured in the form of a voltage regulator component 28' in the second embodiment of the antifuse circuit arrangement 200'.

In both the first embodiment 200 according to FIGS. 2A, 2B and the second embodiment 200' according to FIG. 2C, the drain terminal 16 is brought to a considerably higher potential during programming compared with the reference potential GND, for example to about +4 volts (cf. FIG. 2A).

By applying a positive gate-source voltage being between about 0.4 times and about 0.7 times the level of the drain-source voltage during programming, i.e. is about half the size or slightly more than half the size of the drain-source voltage and is therefore about +2 volts for example in the embodiments according to FIG. 2A to FIG. 2C, a conductive charge carrier channel is formed between the source S and the drain D and therefore a flow of charge carriers between the source S and the drain D is enabled. The semiconductor material 20 is thermally heated by this flow of charge carriers between the source S and the drain D and melts locally, forming a permanently conducting channel between the source S and the drain D.

Starting from FIG. 2A,
  both the part of the antifuse circuit arrangement 200 in FIG. 2B or the part of the antifuse circuit arrangement 200' in FIG. 2C being relevant at the point of programming the antifuse 100
  and the part of the antifuse circuit arrangement 200 in FIG. 2B or the part of the antifuse circuit arrangement 200' in FIG. 2C being relevant at the point of reading or evaluating are shown.

An antifuse circuit arrangement 200, 200' of this type may form a basis for a more complex storage system, for example as may be used in a storage unit for non-volatile storage of bits; in particular a storage unit of this type may comprise an array of area-efficient, one-time electrically programmable permanent storage cells based on the antifuse 100; the antifuse circuit arrangement(s) 200, 200' is or are thus integrated into this array.

A (transistor) switch 30 arranged between the burning or melting current source 26 and the drain terminal 16 is closed for a specific time interval t (=first switch position of the switch 30) by a control unit 300 (so-called programming controller, cf. FIG. 2B or FIG. 2C) for the purpose of burning or programming the transistor 100 in the antifuse circuit arrangement 200 or 200'.

If the switch 30 is closed, not only is a conducting connection created between the burning or melting current source 26 and the side of the first resistor 28a of the voltage divider remote from the gate G, but the positive gate-source voltage (already detailed above with reference to FIG. 2A) is provided in parallel at the antifuse transistor 100, in such way that the transistor 100 is put into the conductive state.

This gate-source voltage is about half the value (or slightly more than about half the value) of the drain-source voltage during programming, i.e. is between about 0.4 times and about 0.7 times the level of the drain-source voltage and is therefore, for example, about +2 volts in the embodiments according to FIG. 2A to FIG. 2C.

It is generally targeted that a maximum drain-source voltage level is applied at a minimum voltage level between gate G and the conducting channel, i.e. at a minimum level of the electric field strength between gate G and the conducting channel.

In the first switch position of the switch component 30, i.e. when the switch component 30 is closed, the burning or melting current $I_B$, for example of about five milliamperes, generated by the burning or melting current source 26 can flow. The semiconductor material 20 between the source S and the drain D is thermally heated by this flow of charge carriers $I_B$ and melts locally, forming a permanently conducting channel between the source S and the drain D.

After this "burning process" or "melting process" of the antifuse transistor 100, its drain-source path exhibits considerably lower resistance ($R_{DS} \ll R_{SE}$) compared with a current-limiting component 34 (cf. FIG. 2B) or 34' (cf. FIG. 2C), which is connected between a voltage source 32 provided for supplying supply voltage $V_S$ (for example of about 1.2 volts) and the drain terminal 16, and its resistance $R_{SE}$ may be about 1 megaohm.

In the first embodiment of the antifuse circuit 200 according to FIG. 2B this current-limiting component 34 is configured as an ohmic resistor; in the second embodiment of the antifuse circuit 200' according to FIG. 2C this current-limiting component 34 is configured as a current source.

In order to read or evaluate the circuit arrangement 200, 200', in particular with reference as to whether the antifuse transistor 100 has been programmed or not (yet), i.e. is "burnt" or "damaged" or "destroyed" or not (yet), a decider component 36 is provided, in addition to the supply voltage source 32 and the current-limiting component 34, 34' (-->current strength $I_{SE}$), which does not necessarily have to be configured as an inverter (cf. FIGS. 2B, 2C), but may also be configured, for example, as a comparator.

For the purpose of reading or evaluation, it is examined when the switch 30 is opened or open (=second switch position of the switch 30) how strongly the antifuse transistor 100 is conducting, i.e. how low-resistance the antifuse transistor 100 is:

If the antifuse transistor 100 is programmed, i.e. if it is "burnt" or "damaged" or "destroyed", the antifuse transistor 100 will be in the conducting state, i.e. in the low-resistance state. Due to the voltage divider ratio $R_{DS}/(B_{SE}+R_{DS})$, the input terminal of the inverter 36 is fed with a voltage being equal to the voltage at the drain terminal 16, this fed voltage being considerably lower than $V_S/2$, i.e. being considerably lower than half the supply voltage. A voltage of this value considerably below $V_S/2$ represents a logic "0" at the input of the inverter 36, a logic "1" being given at the output out of the inverter 36, by which the output terminal of the electrically programmable permanent storage cell is simultaneously given.

By contrast, a non-programmed (or unprogrammed), i.e. "non-burnt" (or "unburnt") or "non-damaged" (or "undamaged" or "non-destroyed" (or "undestroyed") transistor 100 that has not yet undergone programming in accordance with the present invention for example is considerably less conductive than the current-limiting component 34, i.e. exhibits considerably high resistance, a voltage above $V_S/2$, i.e. considerably more than half the supply voltage, for example approaching the supply voltage $V_S$ being fed to the input of the inverter 36 as a result of the voltage divider ratio $R_{DS}/(R_{SE}+R_{DS})$. A voltage of this type of considerably more than $V_S/2$ represents a logic "1" at the input out of the inverter 36, a logic "0" being emitted at the output out of the inverter 36, by which the output terminal of the electrically programmable permanent storage cell is simultaneously given.

Correspondingly, in the second embodiment of the antifuse circuit arrangement 200' according to FIG. 2C in the "burnt" or "damaged" or "destroyed" state, i.e. the programmed state of the transistor 100, in view of which the voltage being fed to the input of the inverter 36 (product of the drain-source resistance $R_{DS}$ and the current strength $I_{SE}$) is smaller than the input-based switching threshold $V_{Th}$ of the inverter 36, a logic "1" is given at the output out of the inverter 36, by which the output terminal of the electrically programmable permanent storage cell is simultaneously given, and in the "non-burnt" (or "unburnt") or "non-damaged" (or "undamaged") or "non-destroyed" (or "undestroyed") state, i.e. the non-programmed (or unprogrammed) state of the transistor 100, in view of which the voltage being fed to the input of the inverter 36 (product of the drain-source resistance $R_{DS}$ and the current strength $I_{SE}$) is greater than the input-based switching threshold $V_{Th}$ of the inverter 36, a logic "0" is given at the output out of the inverter 36, by which the output terminal of the electrically programmable permanent storage cell is simultaneously given.

The embodiments according to the present invention (cf. FIG. 1 to FIG. 2C) pose the advantage over the prior art that the active circuit parts do not have to be arranged at a considerable distance from the antifuse. In the present invention active circuit parts can thus be arranged at a minimal distance from the antifuse transistor 100.

The antifuse transistor 100 according to the present invention (cf. FIG. 1), the antifuse circuit arrangement 200 (cf. FIG. 2B) or 200' (cf. FIG. 2C) according to the present invention and the method according to the present invention thus enable a particularly high level of integration with other active circuit parts since there is no need for an increased safety distance between the antifuse and the active circuit.

This results in a decidedly low area requirement, which favours the general trend for miniaturisation of circuit arrangements.

Whilst the substrate potential is conventionally increased, the substrate remains in FIG. 1 to FIG. 2C at a fixed reference potential, namely at earth or ground or zero potential GND (=GrouND).

By increasing the drain terminal 16 to a considerably higher potential compared with the reference potential GND of, for example, about +4 volts and by applying a positive gate-source voltage, the substrate potential is not (or is only insignificantly) increased.

Instead, the transistor 100 is effectively temporarily overloaded in a defined manner; an about 1.2 volt transistor 100 can thus be operated temporarily with a maximum gate voltage of about 2 volts. In this example both the drain-gate voltage and the gate-source voltage are about +2 volts, thus producing a drain-source voltage of about +4 volts.

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

LIST OF REFERENCE NUMERALS 100 programmable antifuse transistor, in particular programmable n-channel MOS transistor
200 antifuse circuit arrangement, in particular one-time electrically programmable permanent storage cell (=first embodiment; cf. FIGS. 2A, 2B)
200' antifuse circuit arrangement, in particular one-time electrically programmable permanent storage cell (=second embodiment; cf. FIG. 2C)
300 control unit, in particular programming controller
10 substrate (corresponding to base), in particular p substrate
12 terminal of the gate G, in particular gate contact or gate terminal
14 terminal of the source S, in particular source contact or source terminal
16 terminal of the drain D, in particular drain contact or drain terminal
18 terminal of the substrate 10, in particular substrate contact or substrate terminal
20 semiconductor material, in particular meltable or melted semiconductor material
22 pn junction, in particular silicon pn junction
24 voltage source, in particular burning or melting voltage source for providing the burning or melting voltage $V_B$
26 current-limiting component, in particular current source, for example for burning or melting current $I_B$
28 component defining the voltage at the gate G, in particular voltage source for biasing the gate G (cf. FIG. 1)
28a first, in particular ohmic resistor of the component 28 defining the voltage at the gate G, in particular of a voltage divider arrangement or of a voltage divider (=first embodiment; cf. FIGS. 2A, 2B)
28b second, in particular ohmic resistor of the component 28 defining the voltage at the gate G, in particular of a voltage divider arrangement or of a voltage divider (=first embodiment; cf. FIGS. 2A, 2B)
28' component defining the voltage at gate G, in particular voltage regulator for biasing the gate G (=second embodiment; cf. FIG. 2C)
30 switch component, in particular transistor switch
32 voltage source, in particular supply voltage source for providing the supply voltage $V_S$
34 current-limiting component, in particular resistor, for example ohmic resistor (=first embodiment; cf. FIGS. 2A, 2B)
34' current-limiting component, in particular current source (=second embodiment; cf. FIG. 2C)
36 decider component or decider, in particular inverter or comparator
D drain (corresponding to collector)
G gate GND reference potential, in particular earth potential or ground potential or zero potential
$I_B$ burning or melting current in input or input terminal of the antifuse circuit arrangement 200, 200'
$I_{sE}$ current strength in the current-limiting component 34, 34'
n n-doped region or n-doping out output or output terminal of the antifuse circuit arrangement 200, 200'
p p-doped region or p-doping
$R_{DS}$ resistor between drain D and source S
$R_{sE}$ resistor of the current-limiting component 34, 34'
S source (corresponding emitter)
t time interval or time period
$V_B$ burning or melting voltage
$V_S$ supply voltage
$V_{Th}$ switching threshold, in particular input-based switching threshold of the decider component 36, in particular of the inverter

What is claimed is:

1. A programmable antifuse transistor, comprising:
   a) at least one gate with a gate terminal;
   b) at least one source with a source terminal;
   c) at least one drain with a drain terminal;
   d) at least one substrate with a substrate terminal;
   e) the level of the potential difference between the source terminal and the substrate terminal is no more than about 0.5 volts;
   f) the drain terminal and the source terminal lie at different potentials; and
   g) at least one of the drain-source voltage and the gate-source voltage is adjustable in such way that a flow of charge carriers occurs between source and drain, causing the semiconductor material between source and drain to be thermally heated and to locally melt, forming at least one permanently conducting channel between source and drain.

2. The antifuse transistor according to claim 1, wherein:
   a) the source terminal and the substrate terminal lie substantially at the same potential during programming, the same potential being at a common reference potential of one of earth potential, ground potential, and zero potential (GND).

3. The antifuse transistor according to claim 1, wherein:
   a) at least one of the drain-source voltage and the gate-source voltage is adjustable in such way that the level of the potential difference between the drain terminal and the source terminal during programming is greater than the maximum permissible nominal operating voltage.

4. The antifuse transistor according to claim 1, wherein:
   a) in order to adjust the drain-source voltage at least one voltage source and at least one current-limiting component are arranged between the drain terminal and the source terminal.

5. The antifuse transistor according to claim 4, wherein:
   a) the at least one voltage source includes at least one of a burning and melting voltage source.

6. The antifuse transistor according to claim 1, wherein:
   a) in order to adjust the gate-source voltage, at least one component defining the voltage at the gate is arranged between the gate terminal and the source terminal in such way that the level of the gate-source voltage during programming is about 0.4 times to about 0.7 times the level of the drain-source voltage.

7. The antifuse transistor according to claim 6, wherein:
a) the voltage divider includes:
   i) at least a first resistor configured as a high resistance resistor between the drain terminal and the gate terminal; and
   ii) at least a second resistor between the gate terminal and the reference potential (GND).

8. The antifuse transistor according to claim 1, wherein:
a) the antifuse transistor includes an n-channel MOS transistor.

9. An antifuse circuit arrangement which includes the programmable antifuse transistor according to claim 1.

10. The antifuse circuit arrangement according to claim 9, wherein:
a) the programmable antifuse transistor includes a programmable n-channel MOS transistor.

11. Non-volatile storage of bits by use of the antifuse circuit arrangement according to claim 10.

12. The antifuse circuit arrangement according to claim 9, wherein:
a) at least one switch component is provided and is controllable by at least one control unit;
b) the antifuse transistor being programmable in at least a first switch position of the switch component; and
c) the programming state of the antifuse transistor being one of readable and evaluatable in at least a second switch position of the switch component.

13. The antifuse circuit arrangement according to claim 9, wherein:
a) at least one current-limiting component is provided, and is connected between at least one voltage source and the drain terminal; and
b) at least one decider component is provided, the input terminal of which lies at substantially the same potential as the drain terminal.

14. Non-volatile storage of bits by use of the programmable antifuse transistor according to claim 1.

15. A method for programming at least one antifuse transistor, comprising:
a) at least one gate with a gate terminal;
b) at least one source with a source terminal;
c) at least one drain with a drain terminal;
d) at least one substrate with a substrate terminal;
e) the level of the potential difference between the source terminal and the substrate terminal is no more than about 0.5 volts;
f) the drain terminal and the source terminal lie at different potentials; and
g) by adjusting at least one of the drain-source voltage and the gate-source voltage a flow of charge carriers occurs between source and drain, causing the semiconductor material between source and drain to be thermally heated and to locally melt, forming at least one permanently conducting channel between source and drain.

16. The method according to claim 15, wherein:
a) during programming, the source terminal and the substrate terminal are kept at substantially the same potential.

17. The method according to claim 16, wherein:
a) at least one of the drain-source voltage and the gate-source voltage is adjusted in such way that at least one of:
   i) the level of the potential difference between the drain terminal and the source terminal during programming is greater than the maximum permissible nominal operating voltage; and
   ii) the level of the gate-source voltage during programming is about 0.4 times to about 0.7 times the level of the drain-source voltage.

18. The method according to claim 16, wherein:
a) the antifuse transistor can be programmed in at least a first switch position of at least one switch component by at least one control unit; and
b) the programming state of the antifuse transistor can be one of read and evaluated in at least a second switch position of the switch component by at least one antifuse circuit arrangement which includes a programmable antifuse transistor including:
   i) at least one gate with a gate terminal;
   ii) at least one source with a source terminal;
   iii) at least one drain with a drain terminal;
   iv) at least one substrate with a substrate terminal;
   v) the level of the potential difference between the source terminal and the substrate terminal is no more than about 0.5 volts;
   vi) the drain terminal and the source terminal lie at different potentials; and
   vii) at least one of the drain-source voltage and the gate-source voltage is adjustable in such way that a flow of charge carriers occurs between source and drain, causing the semiconductor material between source and drain to be thermally heated and to locally melt, forming at least one permanently conducting channel between source and drain.

19. Non-volatile storage of bits by use of the method for programming at least one antifuse transistor according to claim 15.

* * * * *